United States Patent

[11] 3,577,139

[72] Inventor Roy P. Foerster
Thousand Oaks, Calif.

[21] Appl. No. 645,191
[22] Filed June 12, 1967
[45] Patented May 4, 1971
[73] Assignee The Bunker-Ramo Corporation
Canoga Park, Calif.

[54] ANALOG-TO-DIGITAL CONVERTER
10 Claims, 7 Drawing Figs.

[52] U.S. Cl. .......... 340/347, 330/110
[51] Int. Cl. .......... H03k 13/02
[50] Field of Search .......... 340/347; 330/110

[56] References Cited
UNITED STATES PATENTS

| | | | |
|---|---|---|---|
| 2,730,676 | 1/1956 | Barker | 332/11 |
| 3,495,233 | 2/1970 | Saari | 340/347 |
| 3,187,325 | 6/1965 | Waldhauer | 340/347 |
| 2,958,832 | 11/1960 | Clark | 330/110X |
| 3,166,720 | 1/1965 | Rosen et al. | 330/110 |
| 3,187,267 | 6/1965 | Merington | 330/110 |
| 3,329,950 | 7/1967 | Shafer | 340/347 |
| 3,447,146 | 5/1969 | Saari | 340/347 |

OTHER REFERENCES

Burr-Brown Research Corp.'s " Handbook of Operational Amplifier Applications" pg. 42— 43 copyright 1963.

Franklin C. Fitchen, Transistor Circuit Analysis and Design copyright 1960 pages 165— 166.

*Primary Examiner*—Maynard R. Wilbur
*Assistant Examiner*—Charles D. Miller
*Attorney*—Frederick M. Arbuckle

ABSTRACT: A converter responsive to analog input signals for providing "reflected binary" or Gray code output signals. The converter is comprised of a plurality of substantially identical stages connected in cascade. Each stage provides both a digital output signal and a residual analog output signal in response to an analog input signal applied thereto. The level of the residual output signal provided by each stage is determined by a V-shaped transfer characteristic defined by a differential amplifier therein. The residual output signal from each stage constitutes the input signal to a subsequent stage.

*INVENTOR.*
ROY P. FOERSTER
*BY* Lindenberg + Freilich
ATTORNEYS

INVENTOR.
ROY P. FOERSTER
BY Lindenberg & Freilich
ATTORNEYS

INVENTOR.
ROY P. FOERSTER
BY Lindenberg + Freilich
ATTORNEYS

ANALOG-TO-DIGITAL CONVERTER

BACKGROUND OF THE INVENTION

This invention relates generally to analog-to-digital converters and more particularly to an improved converter responsive to analog input signals for providing "reflected binary" or Gray code digital output signals.

U.S. Pat. No. 3,187,325 discloses a converter for converting analog input signals to Gray code digital output signals. The significant characteristic of the Gray code is that no two successive numbers differ by more than a single digit. The converter disclosed by the patent employs a plurality of stages connected in cascade, with each stage exhibiting a V-shaped transfer characteristic between the analog input signal applied thereto and the residual analog output signal provided thereby. MOre particularly, in the cited patent, the V-shaped transfer characteristic of each stage is developed on a "-piecewise" basis; that is, the two "legs" of the V are generated separately and subsequently combined. For example, the two legs are generated by dissimilar feedback paths around a single amplifier, each path developing one-half of the required transfer characteristic. In a first embodiment disclosed in the patent, the two halves of the transfer characteristic are combined by coupling one half through an inverting amplifier to a summing node while coupling the other half to the summing node through noninverting coupling means. It is recognized that the dissimilar paths to the summing node will define different propagation times which will prevent operation at very high speeds. A second embodiment is disclosed in the patent in which the propagation paths are balanced to permit high speed operation. The second embodiment, however, is very costly inasmuch as it requires that the circuit halves be very precisely matched. Additionally, the second embodiment incorporates multiple or "sneak" feedback paths encompassing more than one stage which makes it extremely difficult to stabilize.

SUMMARY OF THE INVENTION

The present invention is directed to an improved analog-to-digital converter and more particularly to an improved stage configuration for use in a multiple stage cascade apparatus for converting analog input signals to Gray code digital output signals.

Briefly, in accordance with the present invention, a V-shaped transfer characteristic is formed by the use of a differential amplifier which functions in a noninverting mode for input signal levels extending in a first direction from a midrange level and in an inverting mode for input signal levels extending in a second direction from the midrange level.

More particularly, consider an analog input signal which can vary over a predetermined range. The input signal is applied to the first stage of the converter. The stage exhibits a V-shaped transfer characteristic which is substantially symmetrical with respect to the midpoint of the predetermined range and thus provides a residual analog output signal whose magnitude depends on the absolute difference between the level of the input signal and the range midpoint. The residual output signal from each stage is then applied to the input of a succeeding stage. The number of stages used, of course, depends upon the conversion resolution desired.

A significant feature of embodiments of the invention involves the incorporation of a normalizing means, e.g., a trimming resistor, in each stage. The trimming resistor enables variations in reference voltage and stage gain, as well as amplifier offset, to be compensated for.

Figure 1:
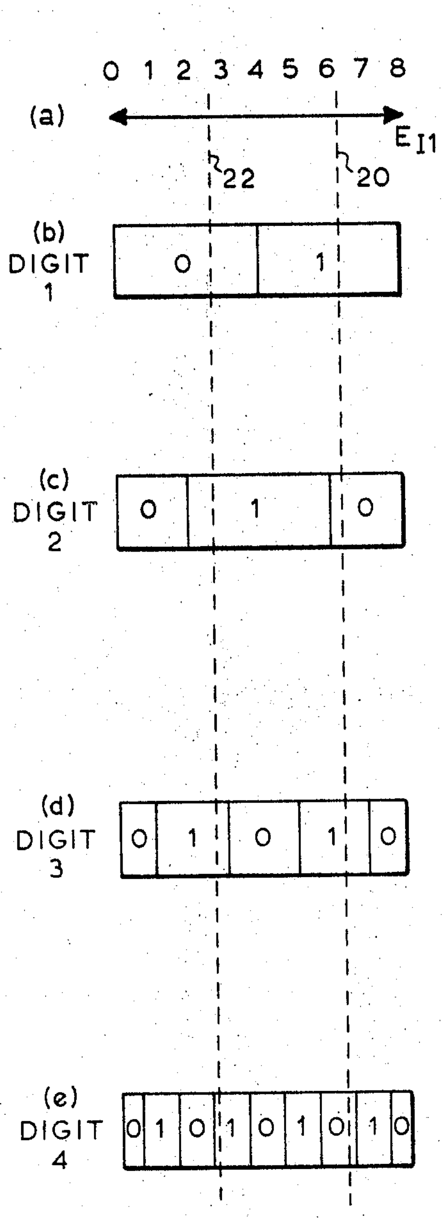
FIG. 1 comprises a diagram illustrating the Gray code representation of an analog quantity.

Attention is now called to FIG. 1, which illustrates the manner in which a four digit reflected binary code group can represent various levels of an analog signal. Note that line (*a*) of FIG. 1 represents an analog input signal $E_{I1}$ whose level will be assumed to lie in a range between 0 and 8 units (e.g., volts). Lines (*b*), (*c*), (*d*), and (*e*) of FIG. 1 respectively define the states of the four digits of a reflected binary code group for any value of input signal. It should be appreciated that utilization of four digits enables the range of the input signal $E_{I1}$ to be quantized into 16 different levels, each level being represented by a different code group. In order to determine the reflected binary code group representative of any level of input signal $E_{I1}$, it is merely necessary to locate that level on line (*a*), and sight down the diagram, reading off the four digits in lines (*b*), (*c*), (*d*), and (*e*). For example, consider that the input signal $E_{I1}$ defines a level 6.2 on the indicated scale 0—8. By sighting down FIG. 1 along the dashed line 20, it will be apparent that the analog level 6.2 will be represented by the reflected binary code 1010. As a further example, an analog input signal having a level 2.8 will be represented by the reflected binary code group 0111 as indicated by dashed line 22.

Figure 4:
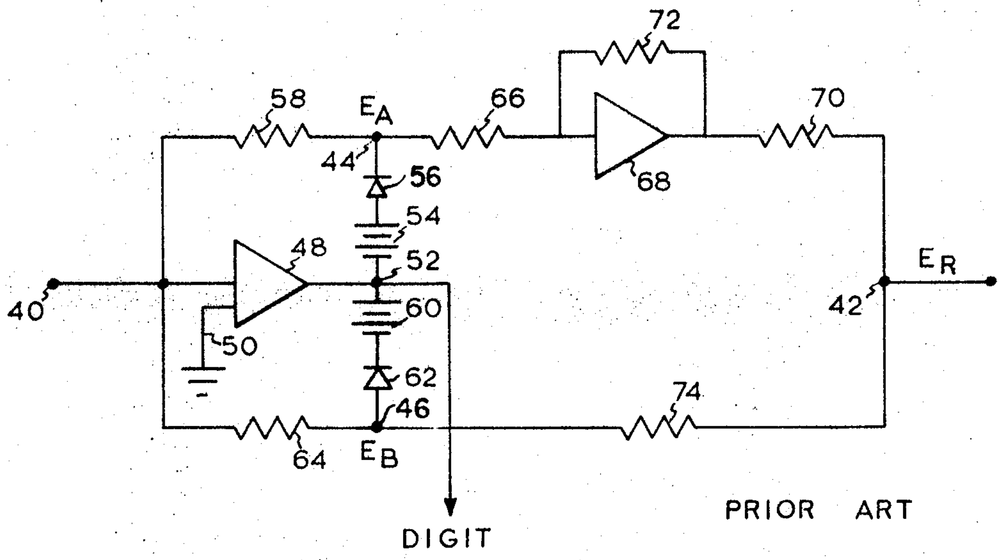
FIG. 4 is a circuit diagram of a typical prior art stage.
Figure 6:
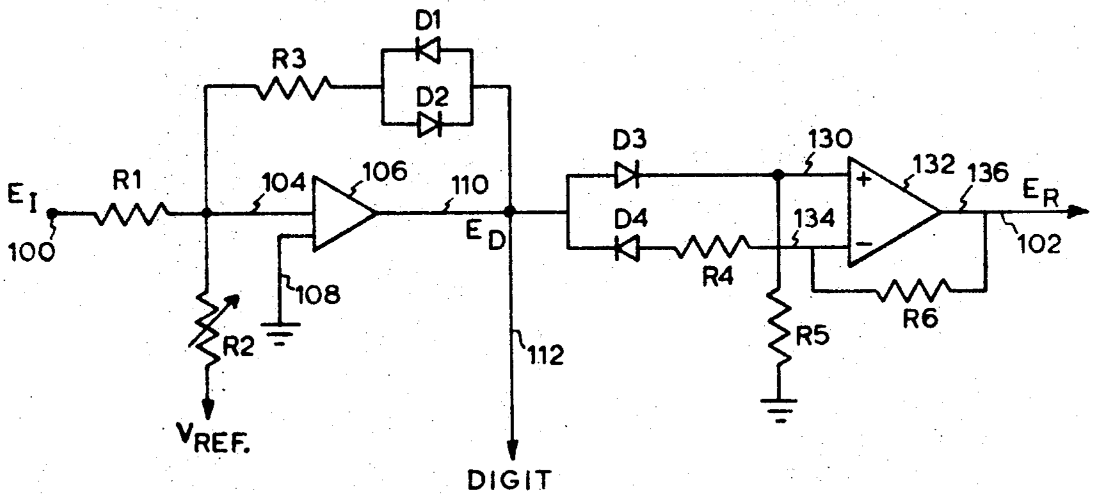
FIG. 6 is a circuit diagram illustrating a preferred embodiment of the present invention.

It is the primary purpose of the present invention to provide an apparatus capable of converting an analog input signal as represented by line (*a*) of FIG. 1 to a corresponding set of reflected binary digits. As previously mentioned, U.S. Pat. No. 3,187,325 discloses an apparatus capable of performing this task, and this apparatus is illustrated in FIG. 4 hereof as being representative of the prior art. An apparatus in accordance with the present invention is illustrated in FIG. 6 hereof. The significant advantages of the apparatus of FIG. 6 over that of FIG. 4 will be discussed hereinafter.

Figure 3:
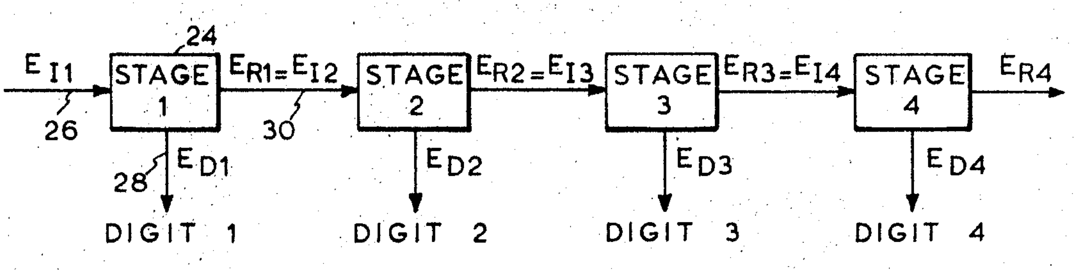
FIG. 3 is a block diagram illustrating a converter comprised of a plurality of substantially identical stages connected in cascade.

In order to convert an analog signal level into a reflected binary code group, a plurality of substantially identical stages (Stage 1, Stage 2, Stage 3, and Stage 4) can be connected in cascade as shown in FIG. 3. Each of the stages typified by block 24 is provided with an analog input terminal 26, a digit signal output terminal 28, an a residual analog signal output terminal 30. The analog signal $E_{I1}$ to be converted is applied to the input terminal 26 of the first stage. The output terminal 30 of each stage is connected to the input terminal 26 of a subsequent stage. Thus, the residual analog output signal developed by each stage is applied as the analog input signal to a succeeding stage. The residual analogue output signal developed by Stage 1 is designated $E_{R1}$. The digital output signal developed by Stage 1 on terminal 28 is designated as $E_{D1}$.

Figure 2:
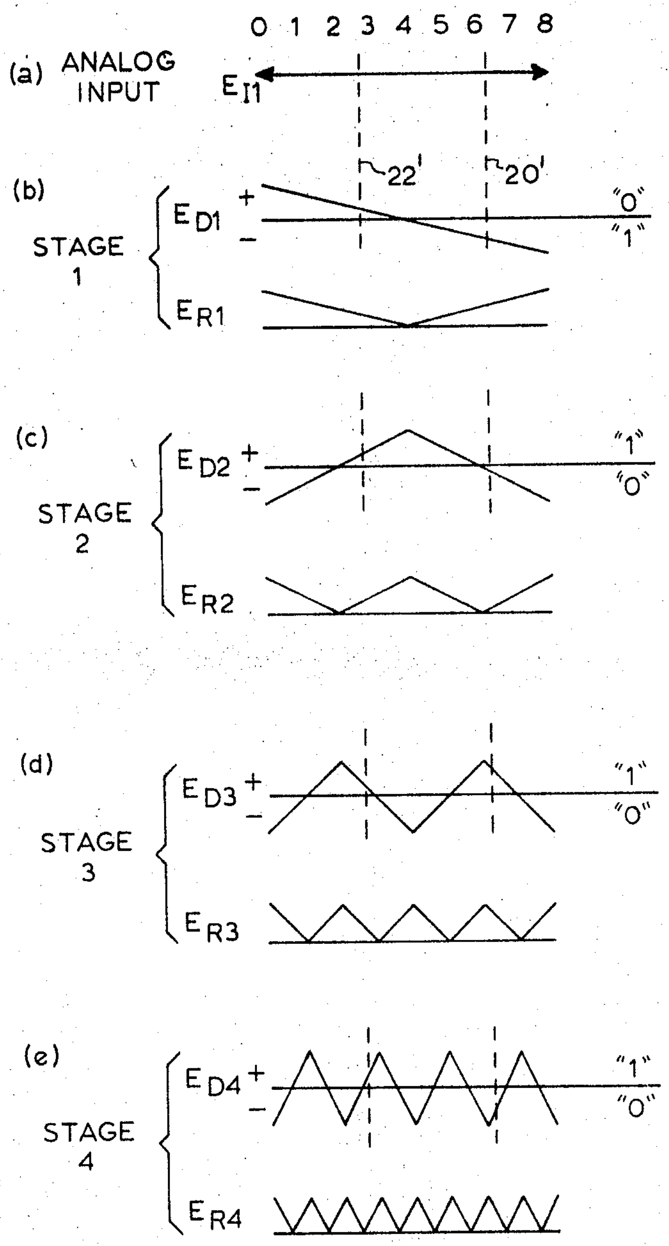
FIG. 2 comprises a diagram similar to FIG. 1 illustrating required stage transfer characteristics for developing digital output and residual output signals for converting an analog input signal to a reflected binary code.

Attention is now called FIG. 2, which demonstrates how the converter of FIG. 3 functions to convert analog input signal levels to reflected binary code signals. Line (*a*) of FIG. 2 is identical to line (*a*) of FIG. 1 and represents the analog input signal range. Line (*b*) of FIG. 2 illustrates the transfer characteristics of Stage 1 showing the values of the digit output and residual output signals $E_{D1}$ and $E_{R1}$ for the various levels of analog input signal. Line (*c*) of FIG. 2 illustrates the transfer characteristics of Stage 2 of FIG. 3 showing the values of signals $E_{D2}$ and $E_{R2}$ produced by Stage 2 in response to the application of signal $E_{R1}$ thereto. Similarly, lines (*d*) and (*e*) of FIG. 2 respectively illustrate the transfer characteristics of Stages 3 and 4 of FIG. 3.

It will be noted that the digit signal characteristics illustrated in lines (*b*), (*c*), (*d*), and (*e*) of FIG. 2 define crossover points corresponding to the state changes in the diagram of FIG. 1. Thus, in line (*b*) of FIG. 2, for example, the signal $E_{D1}$ is positive for the first half of the range of input signal $E_{I1}$ and is negative for the second half of the input signal range. This corresponds to digit 1 represented in FIG. 1 as constituting a 0 for the first half of the input signal range and constituting a 1 for the second half of the input signal range. Note that for signal $E_{D1}$ a positive polarity represents a binary 0 and a negative polarity represents a binary 1. For subsequent stages, a positive value of the digit signal represents a binary 1 and negative values represent a binary 0. For example, note line (*c*) of FIG. 2 in which the signal $E_{D2}$ is negative for the first and last quarters of the input signal range and positive therebetween. This corresponds to digit 2 in FIG. 1 which is 0 for the first and last quarters of the input signal range and 1 therebetween.

FIG. 2 illustrates by dotted lines 20' and 22' the conversion of input signal levels 6.2 and 2.8 respectively represented by the dotted lines 20 and 22 in FIG. 1. Note that for the value 6.2 represented by dotted line 20', the stages 1—4 of FIG. 3 will respectively provide the digits 1010 which correspond to the code group indicated for this input signal value indicated in FIG. 1. Similarly, the input signal level 2.8 will cause stages 1—4 of FIG. 3 to respectively provide binary signals 0111 which correspond to the representation indicated in FIG. 1.

From what has been said thus far, it should now be appreciated that by defining the transfer characteristics shown in FIG. 2, the converter of FIG. 3 will provide reflected binary code signals in response to an input analog signal. It should be realized that the transfer characteristics represented in FIG. 2 are identical for all of the stages. More particularly, it will be noted that Stage 1, for example, responds to the range of input signal $E_{I1}$ to provide an output signal $E_{D1}$ having a range which intersects 0 or ground potential at the midpoint of the input signal range. It can be assumed, for example, that the range of input signal $E_{I1}$ is 0 to 8 volts. The signal $E_{D1}$ can have a range which extends, for example, from +8 volts to −8 volts. Thus, when the input signal $E_{I1}$ defines a level of +4 volts, the signal $E_{D1}$ will be at ground potential. The residual signal $E_{R1}$ can be considered as constituting the signal $E_{D1}$ except that the negative half of the range of signal $E_{D1}$ is inverted. Thus, for example, signal $E_{R1}$ can have a range from 0 to +8 volts. When the signal $E_{D1}$ is at either +8 or −8 volts, the signal $E_{R1}$ will be at +8 volts. When the signal $E_{D1}$ is at ground potential, the signal $E_{R1}$ will be at ground potential.

It should be appreciated that Stage 1 should define a V-shaped transfer characteristic in order to provide the signal $E_{R1}$ shown in FIG. 2 in response to the input signal $E_{I1}$. The V-shaped characteristic should be symmetrical about the midpoint of the input signal range. Stages 2, 3, and 4 can be identical to Stage 1 and define the same characteristic. Thus, Stage 2 will provide signal $E_{D2}$ from signal $E_{R1}$ by inverting signal $E_{R1}$, amplifying it, and increasing its midpoint to some positive level, e.g., +8 volts.

As noted hereinabove, a prior art circuit for exhibiting the required V-shaped characteristic is described in U.S. Pat. No. 3,187,325 and is shown in FIG. 4 herein. The circuit of FIG. 4 can comprise one stage of the converter of FIG. 3. The V-shaped residual output signal characteristic shown in FIG. 5(*c*) and provided on output terminal 42 constitutes the sum of separately formed signals $E_A$ and $E_B$ respectively available on terminals 44 and 46.

The circuit of FIG. 4 employs a nonlinear network, e.g., an amplifier 48 having a ground connection 50 and an output terminal 52. The input terminal of amplifier 48 is connected to the stage input terminal 40. A first feedback path around amplifier 48 consists of battery 54, diode 56, and resistor 58. A second feedback path consists of battery 60, diode 62, and resistor 64.

The potential at the input to amplifier 48 can be considered as remaining substantially at ground. This results from the fact that amplifier 48 has both a high current gain and a high voltage gain. Accordingly, when the voltage at the amplifier output is finite, the potential at the input is negligible. Likewise, with finite amplifier output current, the input current (exclusive of feedback patch currents) is also negligible. In order to more clearly understand this operational feature of the amplifier 48, it may be helpful to consider the amplifier 48 as being a differential amplifier having a grounded input connection 50. The voltage delivered to the output terminal is then equal to the difference between ground and the actual potential at the input times the very high gain of the amplifier. If the amplifier output voltage is not unreasonably large, it follows that the aforementioned difference voltage must be very small indeed.

Figure 5:
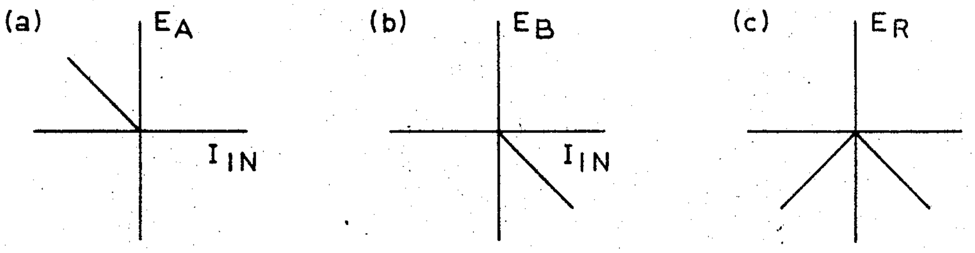
FIG. 5 illustrates operational characteristics of the circuit of FIG. 4.

The amplifier 48 introduces one net phase reversal. Thus, when the input signal applies positive current, i.e., into the amplifier 48, the potential at output terminal 52 is negative and diode 56 is back biased. In this condition, no current flows through resistance 58 and the voltage $E_A$ is therefore 0. On the other hand, when the input current is negative, the potential at output terminal 52 is positive, thus forward biasing diode 56 so that voltage $E_A$ is positive. This relationship is represented by FIG. 5(*a*). The relationship between the voltage $E_B$ and the input current shown in FIG. 5(*b*) should be apparent from what has thus far been said with respect to voltage $E_A$.

The signals $E_A$ and $E_B$ are combined at the summing node 42 by connecting terminal 44 through resistor 66, amplifier 68, and resistor 70 to terminal 42. Feedback resistor 72 is connected around amplifier 68. Terminal 46 is connected to the summing node 42 through resistor 74.

Inasmuch as amplifier 68 introduces one phase reversal, the voltage $E_A$ is inverted in polarity, thereby developing a current which appropriately combines with the current developed by voltage $E_B$ to provide the desired inverted V transfer characteristic shown in FIG. 5(*c*) at out put terminal 42.

Although the prior art circuit of FIG. 4 may operate satisfactorily at low speeds, it is incapable of operating at high speeds because the propagation times exhibited to signals $E_A$ and $E_B$ are unequal. Moreover, the circuit of FIG. 4 is unstable as a consequence of the feedback path from stage output terminal 42 to stage input terminal 40 through resistors 64 and 74.

The aforecited patent apparently recognizes the limitations of the circuit of FIG. 4 and consequently discloses a further embodiment in FIG. 11 thereof in which the circuit paths are balanced to avoid differences in propagation times. The improved embodiment shown in FIG. 11 of the cited patent includes two identical circuit halves in each stage which need be precisely matched to assure a balance condition and permit high speed operation. The requirement of precise matching makes the circuit rather expensive. Additionally, the improved circuit includes multiple "sneak" feedback paths encompassing more than one stage which make it extremely difficult to stabilize.

An embodiment of the present invention is illustrated in FIG. 6 herein. The circuit of FIG. 6 performs essentially the same tasks as are performed by the circuits of the cited patent but, however, avoids several undesireable attributes thereof. Initially, no feedback paths are provided between the stage output and input terminals, and as a consequence the circuit of FIG. 6 has excellent stability characteristics. Additionally, the circuit is essentially balanced in that it does not require the two halves of the resulting V-shaped characteristic to propagate along paths having different propagation times. Further, the requirement that resistive components be precisely matched is considerably relaxed. Still further, the circuit of FIG. 6 incorporates a trimming resistor which permits the input signal to be normalized, thus compensating for variations in reference voltage and stage gain, as well as amplifier offset.

The circuit of FIG. 6 constitutes one stage of the converter of FIG. 3. It includes a stage input terminal 100 and a stage output terminal 102. The stage input terminal 100 is connected through a resistor R1 to a first input terminal 104 of an amplifier 106. A second input terminal 108 is grounded. The input terminal 104 is connected through a trimming resistor R2 to a source of reference voltage. First and second feedback paths are provided between amplifier output terminal 110 and input terminal 104. More particularly one path is defined by diode D1 connected in series with resistor R3. A second path is defined by diode D2 connected in series with resistor R3. Diodes D1 and D2 are oppositely poled and connected in parallel.

Figure 7:
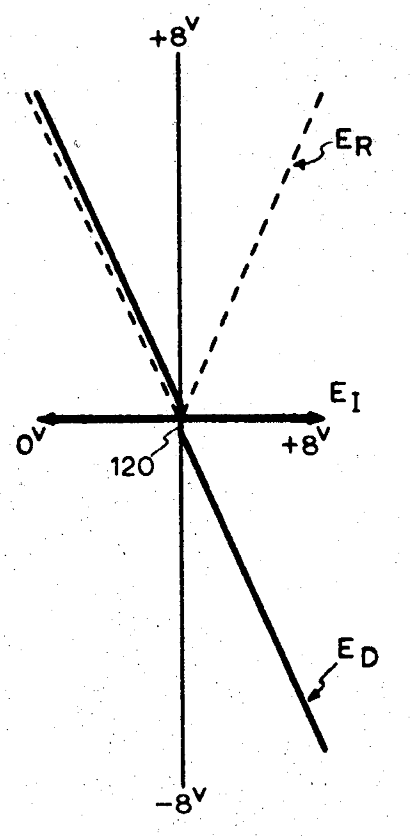
FIG. 7 is a diagram illustrating the transfer characteristics of the circuit of FIG. 6.

The portion of the circuit of FIG. 6 thus far described is responsive to an analog input signal $E_I$ to produce the digital output signal $E_D$ as shown in FIG. 7. Thus, assuming the circuit of FIG. 6 to constitute Stage 1, the analog input signal $E_{I1}$ *of FIG. 2, line (a)*, will be applied to stage input terminal 100 to produce the digit signal $E_{D1}$ shown in FIG. 2, line (*b*), at output terminal 110.

More particularly, consider the signal $E_I$ as shown in FIG. 7 varying, e.g., between 0 volts and +8 volts. Assume the reference voltage applied to trimming resistor R2 to be approximately −4 volts. Accordingly, when signal $E_I$ is at 0 voltage, amplifier 106 will provide an output potential sufficient to provide a feedback current to essentially reduce the differential voltage between terminals 104 and 108 to 0. Assuming the closed loop gain of amplifier 106 to be 2, a +8 volt potential will be provided at amplifier output terminal 110. At the other extreme when the input signal $E_I$ is +8 volts, the amplifier 106 will provide a negative output signal of −8 volts in order to reduce the differential input voltage to 0. It should also be appreciated that, when the analog input signal level is at about +4 volts, the amplifier 106 will provide approximately a ground potential at output terminal 110. In summary, it can therefore be said that the circuit means between terminals 100 and 110 provides an output signal $E_D$ at terminal 110 whose magnitude is substantially proportional to the difference in magnitude between the input signal applied to terminal 100 and a threshold voltage of +4 volts and which has a fist first polarity in the event said input signal exceeds said threshold voltage and a second polarity in the event said input signal magnitude is less than a said threshold voltage.

It will be noted that the digit output signal $E_D$ provided at output terminal 110 and represented in FIG. 7 is not strictly linear, but includes a notch portion 120. This is accounted for by the drop across diodes D1 and D2. More particularly, when the level of the analog input potential is close to +4 volts, neither the diode D1 nor the diode D2 will be forward biased. As a consequence, the feedback path around amplifier 106 will be open and the amplifier output signal $E_D$ will very substantially for small changes in the amplifier input signal $E_I$.

It has thus been shown that the signal $E_D$ will be provided at the output terminal 110. Sense apparatus (not shown) will be coupled to the output terminal 110 by digit line 112 to detect whether the digit provided by that stage is a 1 or 2 0 in accordance with the criteria previously mentioned in conjunction with FIG. 2. The notch portion 120 of the characteristic of signal $E_D$ facilitates the sensing of the signal polarity inasmuch as the signal very rapidly switches from positive to negative and vice versa. The circuit apparatus shown to the right of the digit line 112 in FIG. 6 forms the residual analog output signal $E_R$, having the V-shaped characteristic shown in FIG. 7, from the signal $E_D$. More particularly, the output terminal 110 is connected through a diode D3 to the first terminal 130 of a differential amplifier 132. The terminal 130 is connected through a relatively low impedance resistor R5 to ground. Additionally, the output terminal 110 is connected through diode D4 and resistor R4 to a second terminal 134 of differential amplifier 132. The output terminal 136 of amplifier 132 is connected through feedback resistor R6 to the input terminal 134. The output terminal 136 of amplifier 132 is connected to the gate output terminal 102.

In the operation of the circuit of FIG. 6, the differential amplifier 132 functions in a noninverting mode for positive values of input signals $E_D$ and in an inverting mode for negative values of signal $E_D$. More particularly, consider that signal $E_D$ is positive. Thus, diode D3 is forward biased and diode D4 is back biased. Thus, the feedback loop through resistor R6 is open and amplifier 132 merely comprises a unity gain amplifier. Thus, the first half of the V-shaped characteristic of signal $E_R$ shown in FIG. 7 approximates the positive portion of the characteristic of signal $E_D$. If the diodes D1 and D3 (and the diodes D2 and D4) are properly matched, the signal $E_R$ will not be notched as the signal $E_D$ is at 120. Diode matching is made less critical by making R3=R4=R5. The resulting degree of match will be satisfactory at any temperature and for any signal level.

When the signal $E_D$ is negative, the diode D3 will be back biased and the diode D4 will be forward biased. The input terminal 130 of amplifier 132 will be essentially grounded through the resistor R5 which comprises a relatively low impedance compared to the very high input impedance of amplifier 132. Thus, resistor R5 effectively shorts terminal 130 to ground. Accordingly, amplifier output terminal 136 will feed a current back to input terminal 134, tending to maintain it at ground potential.

From the foregoing, ti it should be appreciated that an improved analog to reflected binary code converter has been disclosed herein which is very stable, capable of providing a very fast response, and capable of providing digits to virtually any resolution desired. A preferred embodiment of the invention makes use of a plurality of stages connected in cascade. Each stage provides a digit signal and a residual output signal to a subsequent stage. The residual output signals are preferably normalized in each stage, and thus all of the stages can be identical. The circuit configuration of each stage includes a differential amplifier for inverting signals above midrange and not inverting signals below midrange.

I claim:

1. An analog-to-digital converter stage including a stage input terminal:
   - a stage input terminal;
   - a stage output terminal for producing a residual signal for application to a succeeding stage;
   - means establishing a threshold voltage;
   - circuit means connected to said stage input terminal and responsive to an analog signal applied thereto for providing a circuit means output signal having a magnitude proportional to the difference in magnitude between said analog signal and said threshold voltage and having a first polarity in the event said analog signal magnitude exceeds said threshold voltage and a second polarity in the event said analog signal magnitude is less than said threshold voltage;
   - a differential amplifier having first and second input terminals and an output terminal;
   - oppositely directed unidirectional current analog means respectively coupling said circuit means output signal to said first and second differential amplifier input terminals; and
   - means connecting said differential amplifier output terminal to said stage output terminal.

2. The stage of claim 1 including relatively low impedance means connecting said differential amplifier first input terminal to a source of reference potential; and
   - feedback path means connecting said differential amplifier output terminal to said differential amplifier second input terminal.

3. An analog to reflected binary code converter comprising:
   - a converter input terminal;
   - a converter output terminal;
   - a plurality of substantially identical stages including first and last stages and one or more intermediate stages, each of said stages having an input terminal and an output terminal;
   - each of said stages including a differential amplifier means responsive to a signal applied thereto whose level lies within a predetermined range for providing a residual signal at the stage output terminal whose level is proportional to the absolute difference between the level of said applied signal and the midpoint of said range;
   - means connecting said converter input terminal to said first stage input terminal;

means connecting each of said first and intermediate stage output terminals to the input terminal of succeeding stage;

means connecting said last stage output terminal to said converter output terminal;

each of said differential amplifier means comprising a differential amplifier having first and second input terminals and an output terminal; and means including oppositely directed unidirectional current conducting devices respectively connecting each stage input terminal to the first and second input terminals of the differential amplifier of that stage.

4. The converter of claim 3 including relatively low impedance means connecting said differential amplifier first input terminal to a source of reference potential; and feedback path means connecting said differential amplifier output terminal to said differential amplifier second input terminal.

5. An analog to reflected binary code converter comprising:

a converter input terminal;

a converter output terminal;

a plurality of substantially identical stages including first and last stages and one or more intermediate stages, each of said stages having an input terminal and an output terminal;

each of said stages including a differential amplifier means responsive to a signal applied thereto whose level lies within a predetermined range for providing a residual signal at the stage output terminal whose level is proportional to the absolute difference between the level of said applied signal and the midpoint of said range;

means connecting said converter input terminal to said first stage input terminal;

means connecting each of said first and intermediate stage output terminals to the input terminal of a succeeding stage;

means connecting said last stage output terminal to said converter output terminal;

each of said stages including amplifier means connecting the stage input terminal to the differential amplifier means thereof, each of said amplifier means having input and output terminals; and first and second oppositely directed unidirectional current conducting means connecting the output terminal of each of said amplifier means to the input terminal thereof.

6. The converter of claim 5 wherein each of said stages includes a normalizing means connecting said stage input terminal to said amplifier means input terminal, said normalizing means including trimming means for adjusting the range of signal applied to said amplifier means input terminal to be symmetric with respect to some predetermined signal level.

7. The converter of claim 5 wherein each of said differential amplifier means comprises a differential amplifier having first and second input terminals and an output terminal; and third and fourth oppositely directed unidirectional current conducting means respectively connecting the amplifier means output terminal of each stage to the first and second input terminals of the differential amplifier stage.

8. The converter of claim 7 including relatively low impedance means connecting said differential amplifier first input terminal to a source of reference potential; and feedback path means connecting said differential amplifier output terminal to said differential amplifier second input terminal.

9. A converter stage for converting an analog signal within a predetermined range to reflected binary code signals, said converter stage including:

a stage input terminal;

a stage output terminal for producing a residual signal for application to a succeeding stage;

circuit means connected between said stage input terminal and said stage output terminal for inverting signals applied to said stage input terminal having a level extending in a first direction from the midpoint of said predetermined range and for directly coupling without inversion signals applied to said stage input terminal having a level extending in a second direction from said midpoint;

said circuit means including a differential amplifier having first and second amplifier input terminals and an amplifier output terminal; and coupling means connecting said stage input terminal to said first and second amplifier input terminals and said amplifier output terminal to said stage output terminal.

10. The converter stage of claim 9 wherein said coupling means includes first and second oppositely directed unidirectional current conducting means respectively connecting said stage input terminal to said first and second amplifier input terminals.